United States Patent [19]

Brown

[11] Patent Number: 4,635,643
[45] Date of Patent: Jan. 13, 1987

[54] ASSAY METHOD FOR THE IN VIVO QUANTITATIVE DETERMINATION OF MINERAL CONTENT IN BONE

[75] Inventor: Charles E. Brown, Hubertus, Wis.

[73] Assignee: The Medical College of Wisconsin Research Foundation, Inc., Milwaukee, Wis.

[21] Appl. No.: 666,961

[22] Filed: Oct. 31, 1984

Related U.S. Application Data

[63] Continuation-in-part of Ser. No. 426,147, Sep. 28, 1982, Pat. No. 4,510,450.

[51] Int. Cl.$^4$ .............................................. A61B 5/04
[52] U.S. Cl. .................................... 128/653; 324/308
[58] Field of Search ................. 128/653; 324/308, 321

[56] References Cited

U.S. PATENT DOCUMENTS

| | | | |
|---|---|---|---|
| 3,789,832 | 2/1974 | Damadian | 128/2 R |
| 4,297,637 | 10/1981 | Crooks et al. | 324/309 |
| 4,318,043 | 3/1982 | Crooks et al. | 324/309 |
| 4,452,250 | 6/1984 | Chance et al. | 128/653 |
| 4,510,450 | 4/1985 | Brown | 324/321 |

OTHER PUBLICATIONS

Tropp, J. et al, "Phosphorus NMR Study of Solid Amorphous Calcium Phosphate", J. Am. Chem. Soc., 1983, vol. 105, pp. 22–26.
Rothwell, W. P. et al, "High-Resolution Variable-Temperature $^{31}$P NMR of Solid Calcium Phosphates", J. Am. Chem. Soc., 102:8, 4/9/1980, pp. 2637–2643.
Herzfeld, J. et al., "Magic Angle Sample Spinning in Inhomogeneously Broadened Biological Systems", Phil. Trans. Royal Soc. London B 289, pp. 459–469, (1980).
General Electric brochure: "Chemical Shift Imaging Systems" (1983).
Phospho-Energetics, Inc. brochure "In Vivo Nuclear Magnetic Resonance- PE 250-80." (1983).

*Primary Examiner*—Kyle L. Howell
*Assistant Examiner*—Francis J. Jaworski
*Attorney, Agent, or Firm*—Quarles & Brady

[57] ABSTRACT

An in vivo assay for quantifying the mineral content of bone comprises placing living bone into or adjacent to the coil of a nuclear magnetic resonance (NMR) spectrometer, recording a $^{31}$P NMR spectrum while the bone is stationary, and comparing the spectrum obtained with the NMR spectrum of a reference standard containing a known concentration of a reference compound. The assay can be used to diagnose and determine the efficacy of treatment of osteodystrophy if used in conjunction with radiographic densitometry to estimate the calcium content of the bone.

6 Claims, 11 Drawing Figures

TO SPECTROMETER

ASSAY METHOD FOR THE IN VIVO QUANTITATIVE DETERMINATION OF MINERAL CONTENT IN BONE

RELATED CASE

This application is a continuation-in-part of my earlier copending application Ser. No. 426,147 filed Sept. 28, 1982 and now U.S. Pat. No. 4,510,450.

FIELD OF THE INVENTION

The present invention relates to a method for the assay of minerals in bone. More particularly, it relates to a novel method of using nuclear magnetic resonance (NMR) to rapidly assay the mineral content of unfractionated bone within a living person. The method is useful in the clinical diagnosis of osteodystrophy, including osteoporosis.

BACKGROUND OF THE INVENTION

In the human body two hormones, parathormone and calcitonin, along with vitamin D have major roles in controlling the metabolism of calcium ($Ca^{++}$) and phosphate (Pi). Binding of parathormone to kidney cells yields among other things increased renal tubular reabsorption of $Ca^{++}$ and $Mg^{++}$, and enhanced excretion of Pi. The rates of renal gluconeogenesis and renal respiration are increased and hydroxylation of vitamin D to its active form (1,25-dihydroxyvitamin D) is increased. In bones, parathormone inhibits collagen synthesis in active osteoblasts, increases osteocytic and osteoclastic osteolysis and increases the rate of maturation of osteoblasts and osteoclasts. There is increased mobilization of $Ca^{++}$ from bone and increased transport of $Ca^{++}$ across the intestine, accompanied by elevation of plasma $Ca^{++}$. Calcitonin reduces bone resorption, perhaps by inhibiting osteocytes and osteoclasts. This is accompanied by hypocalcemia and hypophosphatemia. Enhanced excretion of Pi may be a secondary response to alterations in plasma $Ca^{++}$. Secretion of parathormone is reduced and that of calcitonin is increased in response to elevated $Ca^{++}$ in the circulation.

In the presence of calcitonin, $Ca^{++}$ and Pi are deposited in bone. The exact identities of the intermediates involved in the early steps of mineral deposition are still not known with certainty. It appears that brushite, $CaHPO_4 \cdot 2H_2O$, is deposited first but that it redissolves and is converted to amorphous calcium phosphate, a noncrystalline association of ions. This is believed subsequently to yield octacalcium phosphate, $Ca_8(HPO_4)_2(PO_4)_4 \cdot 5H_2O$, which in turn is converted to hydroxyapatite, $Ca_{10}(OH)_2(PO_4)_6$, the least soluble mineral of the group.

Several pathological conditions in which bone mineralization is deficient have been observed. These can arise from a number of conditions including, for example, abnormalities in hormonal regulation, renal cortical damage and dietary $Ca^{++}$ and phosphate deprivation. The example of osteoporosis is given for illustration.

Osteoporosis is characterized by reduced mineral content of bone, especially trabecular bone, and is particularly prevalent in postmenopausal women. The underlying causes of osteoporosis in the female appear first to arise at about the age of 30-40 years with reduced secretion of calcitonin. This is accompanied by hypocalcemia and subsequent elevation of parathormone. The 1 alpha-hydroxylase activity of the kidney becomes elevated with a probable resulting increase in "remodeling" of mineral deposits, especially in trabecular bone. The skeletal complications of osteoporosis become apparent after the secretion of estrogen begins to decrease (i.e. 40-50 years of age). The metabolism of vitamin D appears to be reduced when the estrogen levels are lower and the intestinal absorption of calcium is affected. The reduced intestinal absorption of calcium appears to place an increased demand on the skeletal system, which in time yields reduced mineral deposits in trabecular bone. This results, for example, in an increased incidence of fractures of the hip and vertabrae. Similar demineralization also can arise from hyperparathyroidism and chronic renal insufficiency.

There is at the present time a clinical need for a rapid assay of the mineral content of bone. The physical and chemical properties of mineral deposits in bone severely limit the physical techniques by which such deposits can be detected. All prior art techniques for bone analysis have serious limitations. Ashing and extraction normally are prerequisites to elemental analysis, and these can result in incomplete recovery of individual components. Furthermore, total phosphate analyses are seriously affected by procedures used routinely in the clinical setting to treat patients. Thus the results of phosphate analyses do not necessarily yield a reliable indication of variations in bone mineralization.

Clinical X-ray procedures provide only a measure of "bone density" toward transmittance of this radiation, which is not indicative of mineral composition. Procedures such as scanning electron microscopy and X-ray crystallography have been used experimentally, but these techniques are cumbersome and time-consuming to perform. Furthermore, the results from these two techniques have not been in full agreement.

In may earlier application an assay is disclosed which includes $^{31}P$ nuclear magnetic resonance (NMR) spectroscopy of bone biopsy samples utilizing cross polarization, magic angle sample spinning and/or dipolar proton decoupling techniques to provide reliable characterization of mineral composition of excised biological samples. The NMR assay is rapid, requires a minimum of sample preparation, and provides the chemical composition of the mineral deposit.

All of the above assays with the exception of clinical radiology, however, require that a bone biopsy be removed from the patient. The taking of such a bone biopsy is very painful and distressing to the patient, and there is a high likelihood that an infection will develop at the locus of tissue extraction. A more desirable approach would be to perform a noninvasive assay of the bone while it is still in the patient. This is especially true if routine screening of women is done to detect osteoporosis early in its onset when it can be treated effectively.

SUMMARY OF THE INVENTION

It is the general object of the present invention to disclose an assay method for quantifying the mineral content in unfractionated bone without the necessity of taking a biopsy sample.

The assay method of the present invention comprises (a) placing a part of the body containing the bone to be assayed into the coil of an NMR spectrometer, (b) recording a $^{31}P$ NMR spectrum while the bone remains still, and (c) comparing the quantitative spectral results with those of a reference standard containing a known concentration of a reference compound.

The assay method can be used in the diagnosis of osteodystrophy by also estimating the calcium content with radiographic densitometry and comparing the results for phosphate and calcium with the results obtained with normal bone to ascertain whether a pathological condition exists.

In a preferred embodiment, the $^{31}$P NMR spectra are recorded by placing the patient or an appendage of the patient into or adjacent to the receiver coil within the magnet of a NMR spectrometer along with a reference standard containing a reference compound (e.g. potassium hexafluorophosphate), of known concentration. $^{31}$P NMR spectra are then recorded and the mineral content of the bone determined from the relative peak areas. The stoichiometry and calcium content of the mineral then is ascertained by use of radiographic densitometry of the bone.

The inventive method provides clinically useful information about mineral content of bone that previously could not be obtained without removal of a biopsy sample followed by labor-intensive fractionation and subsequent assays.

DESCRIPTION OF THE PREFERRED EMBODIMENT

Figure 1:
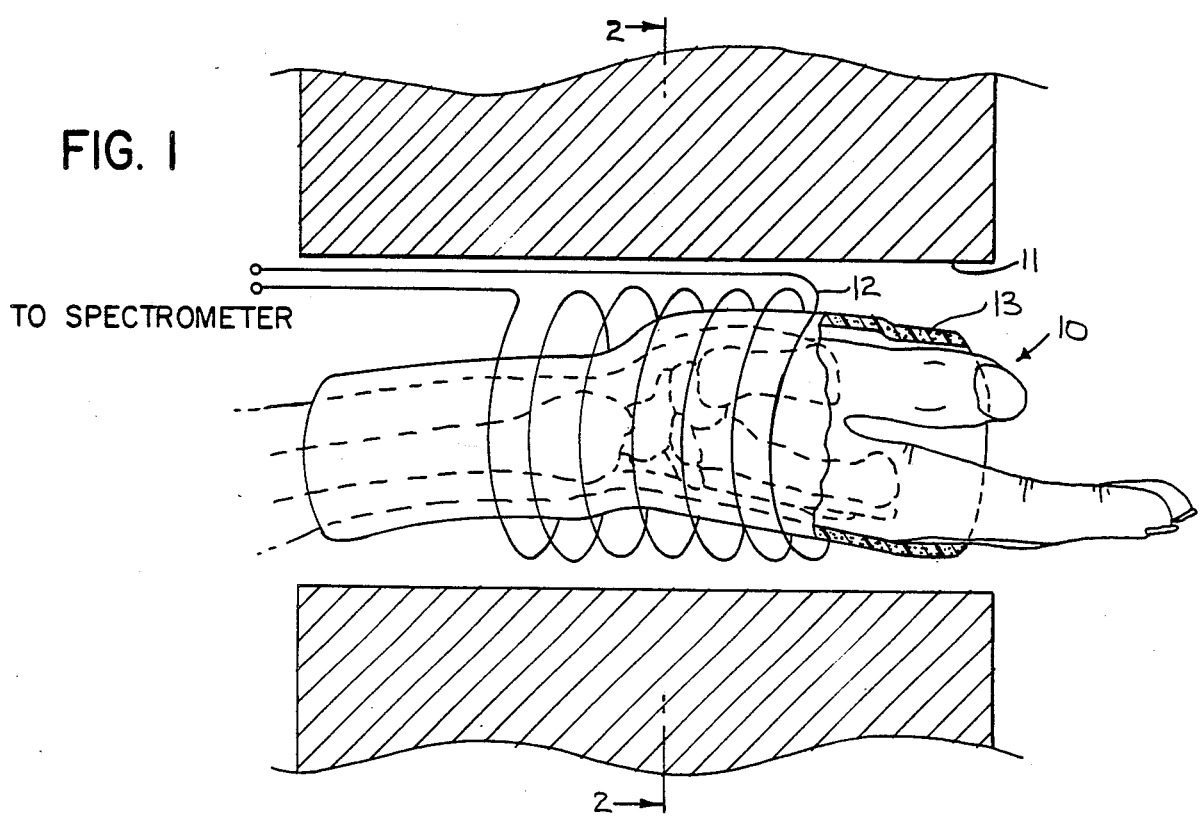
FIG. 1 is a schematic view showing the wrist of a patient and a reference sample in the magnet of an NMR spectrometer. This figure assumes the use of a metal core magnet but it could be drawn just as readily with a superconducting solenoid.
Figure 2:
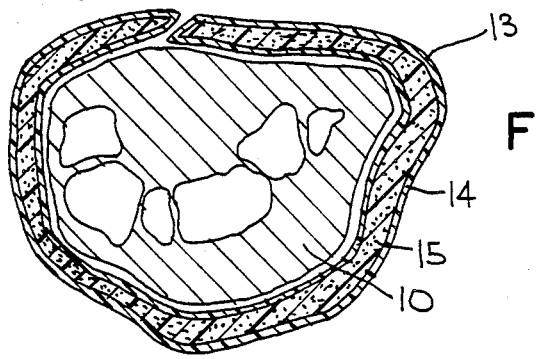
FIG. 2 is a sectional view taken along line 2—2 in FIG. 1.
Figure 3:
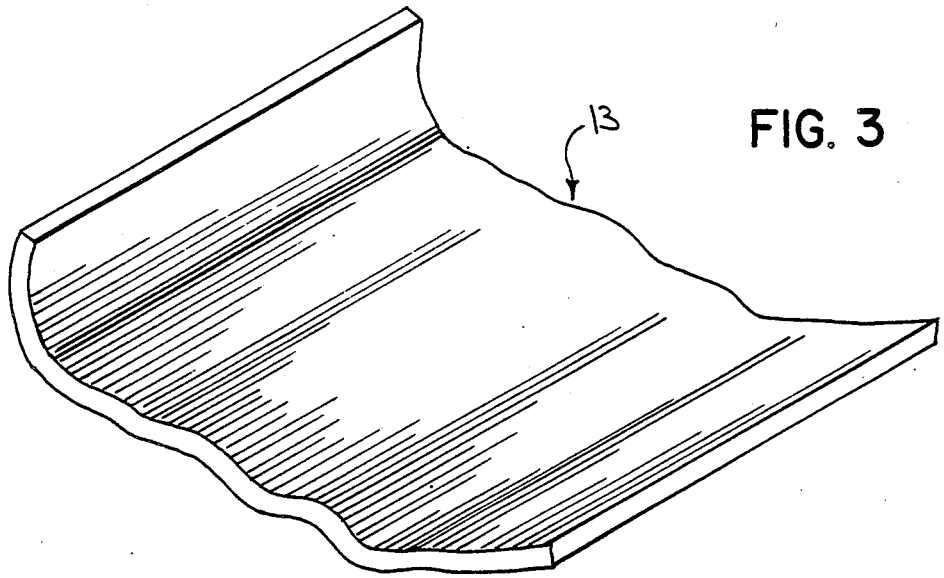
FIG. 3 is a perspective view of the reference standard which is in the form of a conformable sheet.

As seen in FIG. 1, in the preferred embodiment of the present invention, an appendage of a patient, such as a hand 10, is placed in a sample compartment 11 and receiver coil 12 of an NMR spectrometer with a reference standard 13. As seen in FIGS. 2 and 3 the reference standard 13 is a solid sheet-like member of a flexible conformable material 14, such as plastic or rubber, which has a reference compound 15, preferably $KPF_6$, dispersed or suspended therein.

In the method of the present invention $^{31}$P NMR spectra of the patient or his/her appendage are recorded to quantify the mineral content of the bone. The results obtained are compared to those obtained from normal controls and/or to those obtained at an earlier age(s) of the patient thus providing a rapid assay of the mineral content of the bone within the patient. The values for mineral content thus obtained are compared with radiographic densitometry measurements which can be useful in making a medical diagnosis of the patient's condition.

The utility of any spectral technique is related directly to the ease of obtaining spectra and to the ease of interpretation of spectra. The isotopic abundance of $^{31}$P is 100%, and NMR is inherently quite sensitive to this nucleus. Therefore the sensitivity to "unenriched" phosphorus-containing samples is very good as compared for example to $^{13}$C whose natural abundance is only 1.1%. In addition, the $^{31}$P nucleus has a spin of ½ and thus yields narrow peaks in most cases.

With mixtures of phosphate minerals, one is confronted by the difficulty that all biologically important phosphates yield $^{31}$P NMR peaks in a very narrow chemical shift range. Thus resolution of individual peaks in $^{31}$P NMR spectra of bone is very difficult.

The frequency of resonance of a nucleus depends on the strength of the external magnetic field and on the environment of the nucleus. Each nucleus of a particular isotope within a molecule, such as $^{31}$P, will resonate at a slightly different frequency from the others depending on the functional group of which it is a part. This "shielding" of the nucleus from the external magnetic field that gives rise to these differences in resonance frequency is dependent upon not only the identity of the functional group but also on the orientation of the functional group and of neighboring functional groups and molecules. In the gaseous and liquid states these differences in environment are averaged by rapid tumbling so that only an average frequency of resonance is observed that is centered at the frequency of resonance characteristic of that functional group. In the solid state, rapid motion is not possible or is not isotropic or both. Therefore, an array of resonances is observed corresponding to all the orientations of the functional group and of its neighboring molecules. In addition to the frequency of resonance, the relaxation rate of the excited nucleus from the high energy to the low energy level also is dependent upon the orientation and distance of other nuclei. This dependence of relaxation rate is the result of dipolar coupling with the magnetic moments of these other nuclei, which produce small fluctuations in the observed external magnetic field. In the gaseous and liquid states these dipolar interactions are modulated by the rapid, isotropic rotational and translational motion of the molecules. In the solid state the interactions are not modulated by isotropic motion, and, since the dipolar fields are the result of a specific orientation of the dipoles with respect to the applied field, the dipolar broadening is much larger. In the solid state these two effects of chemical shift anisotropy and dipolar broadening produce line widths measured in kilohertz. By comparison, the line widths of resonances in liquids are on the order of 0.1 to 1 Hz. Thus, the primary concern of the NMR spectroscopist who wished to study nuclei in solids has been to preferentially reduce the chemcial shift anisotropies or the dipolar broadening or both in such a manner as to resolve the very broad "powder pattern" to an understandable spectrum analogous to that of liquids. These techniques are well developed and equipment is commerically available for these experiments.

Magic angle sample spinning is used to reduce the line broadening from chemical shift anisotropy. High-power proton decoupling is used to reduce dipolar broadening. Cross polarization can be used under certain circumstances to reduce the time required to obtain a spectrum with acceptable signal-to-noise. These techniques can be used together to produce well resolved spectra or can be used separately to distinguish among the various mechanisms of line broadening.

Many parts of the Hamiltonian for a solid spinning at the magic angle (54°44' from the magnetic field) are identical to those for the liquid phase. Thus, when a solid sample is spun at this angle the orientation effects that cause variations in the chemical shift are averaged to much the same extent as they are from rapid tumbling in the liquid. The "liquid-like limit" is approximated when the solid sample is spun at a rotation frequency greater than the line width of the powder pattern. Since these lines are measured in kilohertz, the main technical requirements associated with this technique are to use a rotor that is capable of withstanding to required high rotation frequency of 1-10 KHz and to use a stator that is capable of keeping the axis of rotation of this spinning rotor as close to the magic angle as possible. When it is not possible to spin the sample rapidly enough to completely average the shielding tensors to a single isotropic value, spinning sidebands at multiples of the frequency of sample spinning are observed.

In principle, observation of $^{31}P$ in the solid phase should require decoupling of every other nucleus in the sample, but in practice one need worry only about coupling of $^1H$ and possibly $^{31}P$ nuclei because the natural abundance of other nuclei with magnetic moments is small. Dipolar broadening of $^{31}P$ nuclei by the more abundant $^1H$ nuclei can be almost totally eliminated simply by measuring a free induction decay in the presence of a decoupling field at the frequency of resonance of the protons. This generally requires about 200 watts of decoupling power.

Cross polarization establishes population distributions of $^1H$ and $^{31}P$ nuclei, which interact with each other and thereby change their respective Boltzman distributions. This maximizes the entropy of the system while maintaining the total energy constant. The cross polarization is performed by administering a Pi/2 pulse to the protons along the Y axis in the rotating frame followed by a long pulse along the X axis in the rotating frame. During this long pulse to the protons, the $^{31}P$ nuclei are pulsed for a time to establish $^1H$-$^{31}P$ contact and then the free induction decay of the $^{31}P$ nuclei is recorded. These $^{31}P$ pulses are repeated as necessary to deplete the polarization of the protons while increasing the sensitivity to the $^{31}P$ nuclei. The time between pulses no longer has a connection to the relaxation time of the $^{31}P$ nuclei; instead it is determined by the relaxation time of the protons. Cross polarization yields the same qualitative spectral results, but with a six-fold savings in time that results from being able to pulse more rapidly. The reason for this savings in time is that the $^{31}P$ nuclei must re-establish thermal equilibrium between pulses in the free induction decay experiment while the more rapidly relaxing $^1H$ nuclei must achieve thermal equilibrium in the cross polarization experiment.

While cross polarization is an important tool for increasing the sensitivity when spectra of $^{13}C$ in solids are recorded, we have discovered that it is not as important for detection of $^{31}P$ in solids. Since the natural abundance of $^{31}P$ is 100% and NMR is quite sensitive to this nucleus, spectra of $^{31}P$ in solid bone can be recorded without the increased sensivity that cross polarization can produce.

The anisotropy of $^{31}P$ shielding tensors of protonated phosphate minerals is greater than that of hydroxyapatite. Thus the protonated phosphate minerals can be distinguished from hydroxyapatite on the basis of the number of spinning sidebands generated by magic angle sample spinning. Furthermore, hydorxyapatite in bone yields a narrow peak in the absence of dipolar proton decoupling, whereas the protonated phosphate minerals yield very broad lines under the same conditions.

We are unaware of any report in which any mineral form other than apatite has been detected in unfractionated bone with CP/MAS $^{31}P$ NMR spectroscopy. It has been shown that density fractionation of bone yields a solid material which exhibits higher order spinning sidebands in its CP/MAS $^{31}P$ NMR spectrum [*Phil. Trans. R. Soc. Lond.* B 289, 459-469 (1980)]. This spectral result was interpreted by the authors to arise from brushite, although the spinning sidebands could arise from almost any protonated phosphate [e.g. *J. Am. Chem. Soc.* 102, 2637-2643 (1980); *J. Am. Chem. Soc.* 105, 22-26 (1983)].

There is one report in which $^{31}P$ NMR spectra of stationary bone samples has been reported [*Phil. Trans. R. Soc. Lond.* B 289, 459-469 (1980)]. The conclusions were, "We show first the futility of studying stationary powder samples of bone ... There are some differences among these spectra ... it would probably be futile to attempt to extract quantitative information from them."

EXPERIMENTAL TECHNIQUES a. Preparation of the Patient

All ferromagnetic objects are removed from the patient, and all nonferromagnetic metal objects are removed from that part of the patient that is placed in the magnet. The patient's body or appendage is placed in the sample compartment, and the patient is told not to move.

b. Measurement of $^{31}P$ NMR Spectra

The $^{31}P$ NMR spectra can be recorded with either continuous-wave or pulse techniques. Since a description of either technique will make use of the other obvious to those skilled in art, only the pulse technique will be described.

Spectra are recorded with a simple pulse at the resonance frequency of phosphorus followed by acquisition of the resulting free induction decay as a function of time. Fourier transform of the free induction decay yields the frequency-domain spectra of the type in FIG. 4. A 60- to 90-degree observe pulse seems best suited for this experiment. Cross polarization need not be used, which reduces both the power requirements of the spectrometer and the possibility of quantitative artifacts. Proton decoupling also need not be used, which reduces the cost of producing the instrument and avoids the possible adverse effects of tissue heating by the decoupling field. Should this possible risk be deemed acceptable, the decoupling equipment can readily be incorporated.

From FIG. 5 it is obvious that the $^{31}P$ nuclei in bone relax very slowly. Thus reliable quantitation can be obtained only by recording the spectrum with a single pulse or by allowing long delays (i.e., greater than one minute) between pulses to avoid saturation.

Figure 4A:
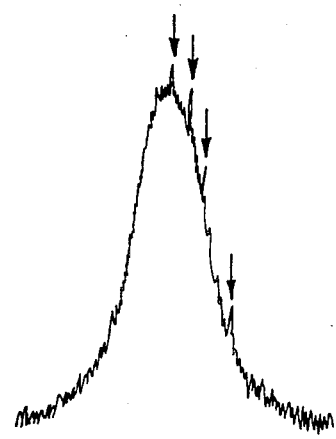
FIGS. 4A, 4B, 4C and 4D are $^{31}$P NMR spectra of (A) solid bone immersed in a solution of 4 mM ATP, 0.05M Tris and 0.15M KCl, (B) powdered hydroxyapatite, (C) powdered brushite and (D) powdered $KPF_6$. The arrows in (A) indicate the narrow peaks from ATP and inorganic phosphate in solution.

There are three general populations of phosphate in biological tissue that, in theory, need to be distinguished. These are (i) the soluble phosphorylated metabolites in the liquid portions of soft tissue, blood and lymph, (ii) the phospholipids in membranes of cells and (iii) minerals of bone. As can be seen in FIG. 4A, the narrow peaks from small phosphorylated metabolites in the liquid medium of soft tissues are easily discriminated from the broader resonance of the bone mineral. It is well known that phospholipids in biological membranes yield very broad resonances, especially in the absence of proton decoupling, and thus do not provide serious interference if the anatomical region being observed is chosen to include a minimum of soft tissue. Thus one readily can measure a spectrum of appropriately chosen anatomical regions in which the primary resonance arises from the mineral content of the bone.

Figure 4B:
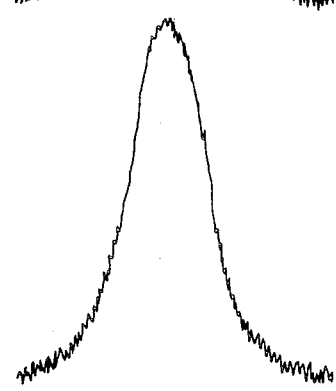
Figure 4C:
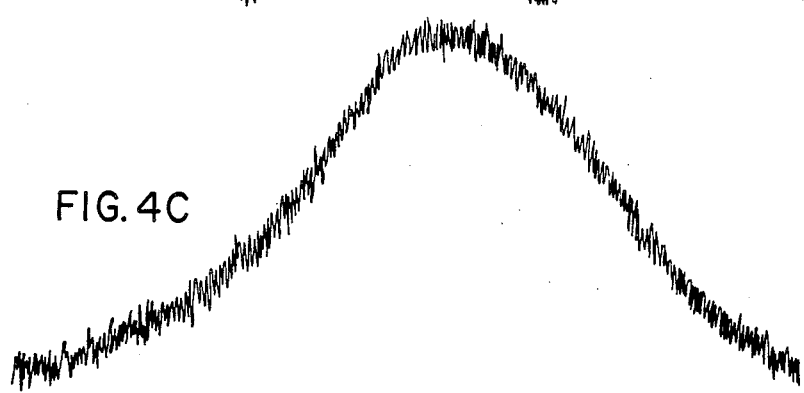

As indicated in Background of the Invention, the shielding tensors of the protonated mineral forms such as brushite are more anisotropic than those of apatite. Furthermore, the phosphorus resonances of the protonated mineral form are subject to dipolar broadening by protons, which is not the case with apatite. Thus the $^{31}P$ spectrum of stationary apatite in the absence of proton decoupling is much narrower than that of the protonated minerals (FIGS. 4B and C). The spectra of stationary apatite and stationary protonated minerals overlap and cannot be resolved, but this is not a serious concern since the only mineral yet detected by NMR in unfractionated bone is apatite. Should a patient be found in which protonated phosphate minerals were above the undetectable level, they would be observed as part of the total mineral content.

c. Design of the Sample Compartment.

The sample compartment is a space within the gap or bore of the magnet of the spectrometer that is large enough to accomodate the body or appendage of a person. Over the active volume of the measurement the magnetic field must be sufficiently homogeneous to permit spectra to be recorded without artifactual line broadening. A wide range of magnetic field strengths can be used. Since the frequency separations between the shielding tensors and between the dipolar coupling tensors increase with increasing magnetic fields, the linewidths of $^{31}P$ peaks from minerals in stationary bone will cover a narrower frequency range at lower magnetic field strengths. By using lower field magnets the apparent widths of the peaks can be narrowed, and, at the same time, the requirements for frequency response of the rf transmitter and receiver can be eased.

The size and geometry of the transmitter/receiver coil(s) depends on the anatomical region to be analyzed. For a region of small diameter, such as a wrist, the anatomical part can be placed inside the coil. For a larger region such as the hip, a surface coil can be employed.

The assay can be performed on any commercial analytical NMR spectrometer that detects $^{31}P$ and is fitted with a wide-bore magnet. At least three such spectrometers for recording $^{31}P$ NMR spectra with wide-bore magnets are avilable on the market today (i.e., Oxford Research Systems TMR-32/200 system, General Electric CSI 2T and CSI 4.7T systems, and Phospho-Energetics, Inc. PE 250-80 system). We believe that the optimum spectrometer has a magnetic field strength of 0.3–5 Tesla and thus operates at a frequency of 5.2–86.7 MHz.

d. Design of a Reference Standard

In the diagonsis of pathology of bone, one must know the concentration of bone mineral. Thus a reference standard for concentration of phosphorus should be included in the spectrum if $^{31}P$ NMR is to be used for diagnostic purposes. The reference standard must contain a reference compound fulfilling three basic criteria. First, the NMR signal from the reference compound should not overlap the signal from the bone. Second, the reference compound must be safe to handle. The reference compound should not be toxic and should not ignite upon contact with damp air. Third, the reference compound must respond to data acquisition in the same way as does the sample so that peak areas are representative of concentrations.

Figure 4D:
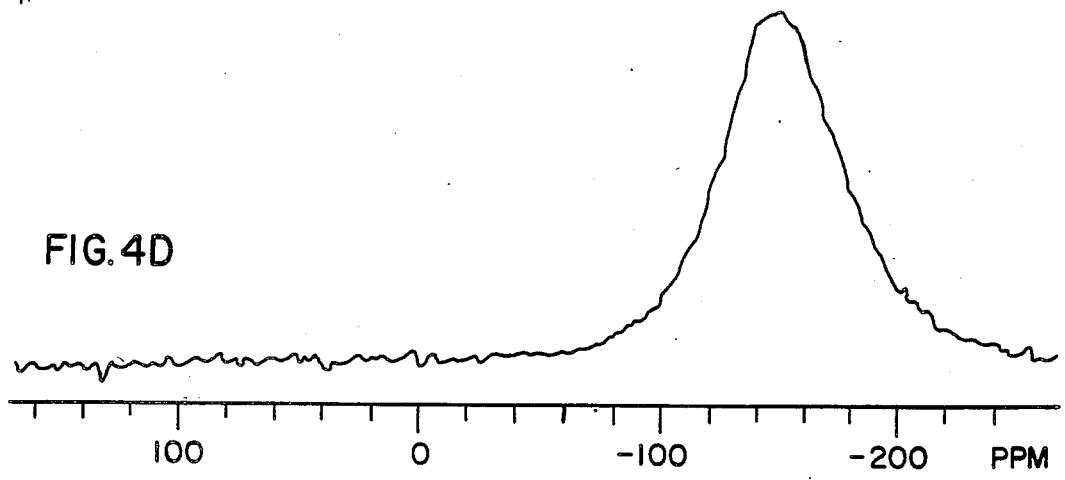
Figure 5A:
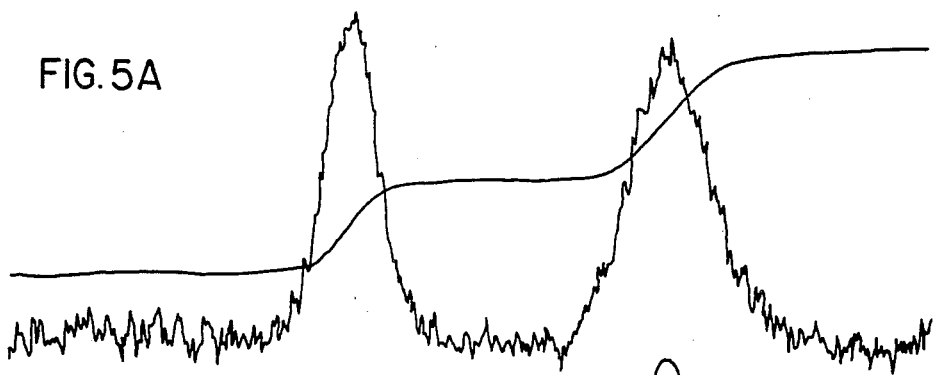
FIGS. 5A–5D show the $^{31}$P NMR spectra of stationary bone surrounded by a solid matrix of $KPF_6$ in polyethylene. (A) was recorded with only one pulse, whereas (B-D) were recorded with 100 pulses. The delays between pulses were (B) 1 minute, (C) 26 sec. and (D) 5 sec. The step curves are digital integrations of relative peak areas.
Figure 5B:
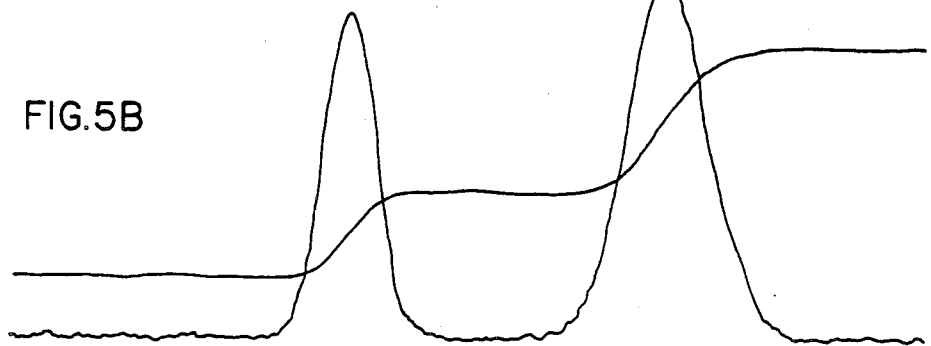
Figure 5C:
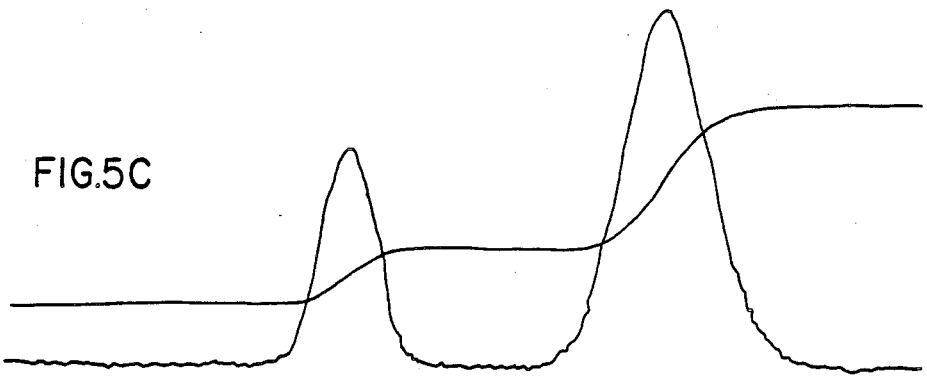
Figure 5D:
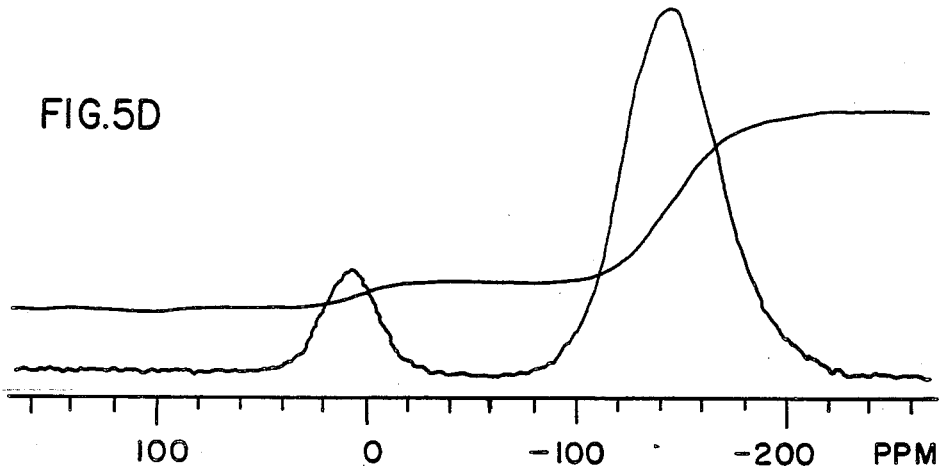

It is important that an appropriate reference compound be selected for the determination of absolute concentrations of phosphorus in bone mineral deposits. Virtually all protonated phosphorus compounds yield $^{31}P$ resonances which overlap those of bone. Thus they are of limited value. Furthermore, it would be advantageous to have a non-protonated reference compound so that its signal amplitude would not change with proton decoupling, should this be deemed safe in the future. These requirements and the requirement of low toxicity and low chemical reactivity in case of accidental breakage are very well filled by the preferred reference compound containing the $PF_6^-$ anion in any organic or inorganic salt (e.g. $KPF_6$). The preferred solid compound, when stationary, will yield a detectable $^{31}P$ NMR spectrum with a line shape similar to that of apatite (FIG. 4D).

Compounds dissolved in liquid solvents could be used as references, but solutions pose a number of problems. First, the line width of the $^{31}P$ NMR peak from a solution is much narrower than that from stationary apatite. Greater digital resolution is needed to provide accurate measurement of areas of narrow peaks than of broad peaks, and thus the use of a reference compound or anion in solution would require digitizing the spectrum into more channels with a commensurate increase in time required for a Fourier transform. Second, packaging of the reference solution would be such that evaporation of the solvent could not occur, and the use of glass poses a risk of accidents from breakage. Third, optimum packaging of the reference compound would be in a flexible form that permits the reference compound to conform to the geometry of the anatomical region being measured.

In the preferred reference standard 13 the reference compound 15 ($KPF_6$), is suspended in a solid rubber or plastic material 14. For use with appendages such as the wrist, which are placed inside the receiver coil, the reference standard 13 can be placed next to the skin like a rod or splint or wrapped around the appendage as a cuff. When surface coils are used the anatomical region can be placed against one side of the receiver coil and an appropriately shaped reference standard containing $KPF_6$ dispersed in rubber or plastic can be placed on the opposite surface of the receiver coil.

The rubber or plastic material 14 of which the reference standard is made can be but is not limited to polyethylene, polypropylene or polybutadienyl rubber. Any material with similar physical properties that does not contain phosphorus will serve the purpose. We prefer to use 50–90% $KPF_6$ by weight with the remainder made up of the plastic or rubber support. The reference standard then is made large enough in physical size to yield a $^{31}P$ NMR peak from the $PF_6^-$ anion that is roughly the same area as that of the bone.

e. Data Manipulation

As described thus far the $^{31}P$ NMR spectrum provides the apatite content of the entire anatomical part in or adjacent to the receiver coil, such as, for example, the wrist in FIG. 1. With reproducible positioning of the anatomical part and reference standard relative to the receiver coil each time an NMR spectrum is recorded, a reliable measure of the relative loss or gain of apatite within the entire anatomical part of a given patient can be measured as a function of time. This should be sufficient for routine screening of patients for onset of osteodystrophy such as osteoporosis and efficacy of treatment.

The concentration and distribution of apatite within each bone can be determined if the size and position of each bone is known. This determination can be made if magnetic gradient coils are added to the sample compartment. Then sections of the type in FIG. 2 could be generated with established imaging techniques (for example, U.S. Pat. Nos. 3,789,832; 4,297,637 and 4,318,043) on the basis of spatial distribution of apatite and/or water protons. Three-dimensional maps of apatite concentration within the bones within the anatomical region could be produced. This would permit, for example, one to distinguish between alterations in density of apatite within a bone and alteration in physical size of that bone.

A less sophisticated approach would be to shape the magnetic field so that there is a small resonant volume. Then the anatomical part would be moved to place the resonant volume at the desired location within the anatomical part. With judicious positioning, one could measure the apatite concentration of a fixed volume of bone.

f. Diagnosis of Osteodystrophy

The assay described above provides the noninvasive quantitative measure of mineral (i.e. apatite) in unfractionated bone within a living person on the basis of its phosphate content. In the diagnosis of osteodystrophy, one may like to know both the calcium and phosphate concentrations of bone mineral deposits. One cannot use the phosphate content of apatite and known stoichiometry of pure hydroxyapatite to calculate the concentration of calcium because nonstoichiometric apatite (i.e. Ca/P=1.33) will yield the same $^{31}P$ NMR spectrum as stoichiometric apatite (i.e. Ca/P=1.67). At present the best noninvasive technique for estimating calcium content of bone is radiographic densitometry. Taken by itself, the densitometry measurement is not very informative. However, taken in conjunction with knowledge of the apatite concentration of the bone, the radiographic density makes it possible to estimate calcium content. Thus the second part of an assay for osteodystrophy is to take a radiographic absorptivity measurement on the same bone in the same orientation as was used to record the $^{31}P$ NMR spectrum.

In the special case of osteoporosis, routine screening of women could commence at about age 35 and a nonivasive $^{31}P$ NMR spectrum of the wrist would be recorded every few years. A running record of the apatite content of the wrist could be kept to detect small, progressive losses of bone mineral with age. Radiographic absorptivity measurements could be performed as deemed apropriate to ascertain whether the stoichiometry of the apatite is changing. These tests also could be used to determine the efficacy of any treatment.

It will be readily apparent to those skilled in the art that a number of modifications and changes can be made without departing from the spirit and scope of the present invention. For example, in place of a receiver coil other resonant antenna may be employed. Thus the term "receiver coil" as used herein and in the claims is intended to cover such equivalent devices. Therefore, it is intended that the invention not be limited except by the claims which follow.

I claim:

1. A noninvasive in vivo assay of the mineral content of a bone in an animal comprises:
    (a) placing the part of the body of the animal containing said bone to be analyzed within the operational range of a receiver coil of a NMR spectrometer;
    (b) recording a $^{31}P$ NMR spectrum of the bone while keeping the bone stationary; and
    (c) then comparing the quantitative spectral results obtained in step (b) to the spectral results obtained with a reference standard containing a known concentration and quantity of a reference compound which responds to $^{31}P$ NMR spectroscopy in a manner similar to that of bone mineral but which does not overlap the resonance of bone material.

2. An assay of claim 1 in which the reference compound contains $PF_6-$.

3. An assay of claim 1 in which the reference standard is a sold, flexible member which contains suspended therein dispersed solid particles of a reference compound which responds to $^{31}P$ spectroscopy in a manner similar to that of bone mineral but does not overlap the resonance of bone material.

4. An assay of claim 1 in which the reference standard is a solid, flexible member which contains suspended therein dispersed solid particles of a reference compound containing the $PF_6-$ anion.

5. An assay of claim 1 in which the spectrum are recorded with receiver coils which surround the bone and body part and which rest on the surface of the body part.

6. A method of diagnosing in vivo osteodystrophy in a living animal which comprises the steps of:
    (a) quantifying the mineral content in a bone in said animal by placing a part of the animal's body containing said bone within the operational range of a receiver coil of an NMR spectrometer with a reference standard which contains a reference compound which responds to $^{31}P$ NMR spectroscopy in a manner similar to bone mineral but does not overlap the resonance of bone material;
    (b) recording a $^{31}P$ NMR spectrum of the bone while keeping said bone stationary; and
    (c) estimating the calcium content of said bone employing radiographic densitometry and then comparing the results obtained with said bone with the results obtained employing radiographic densitometry with normal bone.

* * * * *